US012756376B2

(12) United States Patent
Ushiyama et al.

(10) Patent No.: US 12,756,376 B2
(45) Date of Patent: Oct. 6, 2026

(54) SURFACE ACOUSTIC WAVE DEVICE WITH ACOUSTIC WAVE ENERGY CONFINEMENT

(71) Applicant: Skyworks Solutions, Inc., Irvine, CA (US)

(72) Inventors: Takuya Ushiyama, Moriguchi (JP); Stephen Joseph Kovacic, Newport Beach, CA (US); Joshua James Caron, Summerfield, NC (US); Benjamin Paul Abbott, Irvine, CA (US); Hidehito Shimizu, Neyagawa (JP); Koichi Hatano, Yokohama (JP)

(73) Assignee: Skyworks Solutions, Inc., Irvine, CA (US)

( * ) Notice: Subject to any disclaimer, the term of this patent is extended or adjusted under 35 U.S.C. 154(b) by 88 days.

(21) Appl. No.: 18/597,835

(22) Filed: Mar. 6, 2024

(65) Prior Publication Data

US 2024/0305265 A1 Sep. 12, 2024

Related U.S. Application Data

(60) Provisional application No. 63/450,457, filed on Mar. 7, 2023.

(51) Int. Cl.
*H03H 9/145* (2006.01)
*H03H 9/02* (2006.01)

(52) U.S. Cl.
CPC .... *H03H 9/14541* (2013.01); *H03H 9/02834* (2013.01); *H03H 9/14502* (2013.01)

(58) Field of Classification Search
CPC ........... H03H 9/14541; H03H 9/02834; H03H 9/14502
USPC .................................................. 333/193–196
See application file for complete search history.

(56) References Cited

U.S. PATENT DOCUMENTS

| | | | |
|---|---|---|---|
| 6,972,643 | B2 | 12/2005 | Tsunekawa et al. |
| 7,109,828 | B2 | 9/2006 | Takayama et al. |
| 8,410,865 | B2 | 4/2013 | Jibu et al. |
| 8,487,720 | B2 | 7/2013 | Fujiwara et al. |
| 9,640,750 | B2 | 5/2017 | Nakanishi et al. |
| 9,647,635 | B2 | 5/2017 | Nakamura et al. |
| 10,305,445 | B2 | 5/2019 | Nakamura et al. |
| 10,778,181 | B2 | 9/2020 | Goto et al. |
| 10,873,313 | B2 | 12/2020 | Zou et al. |
| 11,165,406 | B2 | 11/2021 | Lin et al. |
| 11,239,817 | B2 | 2/2022 | Hatano |
| 11,258,427 | B2 | 2/2022 | Kadota et al. |
| 11,368,137 | B2 | 6/2022 | Goto et al. |
| 11,387,808 | B2 | 7/2022 | Shin et al. |
| 11,424,732 | B2 | 8/2022 | Shin et al. |
| 11,431,319 | B2 | 8/2022 | Goto |
| 11,444,599 | B2 | 9/2022 | Sasaki et al. |
| 11,652,466 | B2 | 5/2023 | Fujiwara |
| 11,677,380 | B2 | 6/2023 | Fujiwara et al. |
| 11,705,883 | B2 | 7/2023 | Hiramatsu et al. |
| 11,843,366 | B2 | 12/2023 | Fukuhara et al. |
| 11,870,421 | B2 | 1/2024 | Hiramatsu et al. |
| 11,876,507 | B2 | 1/2024 | Komatsu et al. |

(Continued)

*Primary Examiner* — Jorge L Salazar, Jr.
(74) *Attorney, Agent, or Firm* — VIA LLP

(57) ABSTRACT

A surface acoustic wave device has a trench formed adjacent to at least one interdigital transducer electrode into the piezoelectric substrate. The trench can be adapted to enhance confinement of acoustic wave energy provided by the interdigital transducer electrode.

19 Claims, 8 Drawing Sheets

(56) References Cited

U.S. PATENT DOCUMENTS

| | | | | |
|---|---|---|---|---|
| 11,990,892 | B2 | 5/2024 | Liu et al. | |
| 2013/0207747 | A1* | 8/2013 | Nishii | H03H 9/6406 310/313 R |
| 2018/0159494 | A1 | 6/2018 | Goto et al. | |
| 2019/0273480 | A1 | 9/2019 | Lin et al. | |
| 2020/0028487 | A1 | 1/2020 | Caron | |
| 2020/0212882 | A1 | 7/2020 | Shin et al. | |
| 2021/0159883 | A1 | 5/2021 | Kadota et al. | |
| 2022/0209738 | A1 | 6/2022 | Torazawa et al. | |
| 2022/0271730 | A1 | 8/2022 | Abbott et al. | |
| 2022/0271733 | A1 | 8/2022 | Abbott et al. | |
| 2022/0271734 | A1 | 8/2022 | Abbott et al. | |
| 2022/0321088 | A1 | 10/2022 | Goto et al. | |
| 2022/0321096 | A1 | 10/2022 | Goto et al. | |
| 2023/0006637 | A1* | 1/2023 | Goto | H03H 9/02874 |
| 2023/0013597 | A1 | 1/2023 | Goto et al. | |
| 2023/0028925 | A1 | 1/2023 | Kobayashi | |
| 2023/0031568 | A1 | 2/2023 | Tang et al. | |
| 2023/0070350 | A1 | 3/2023 | Goto | |
| 2023/0105034 | A1 | 4/2023 | Fukuhara et al. | |
| 2023/0107376 | A1 | 4/2023 | Goto et al. | |
| 2023/0107820 | A1 | 4/2023 | Fukuhara et al. | |
| 2023/0108686 | A1 | 4/2023 | Fukuhara et al. | |
| 2023/0111032 | A1 | 4/2023 | Goto et al. | |
| 2023/0111476 | A1 | 4/2023 | Fukuhara et al. | |
| 2023/0111849 | A1 | 4/2023 | Maki et al. | |
| 2023/0113099 | A1 | 4/2023 | Goto et al. | |
| 2023/0223919 | A1 | 7/2023 | Goto et al. | |
| 2023/0225212 | A1 | 7/2023 | Goto et al. | |
| 2023/0253952 | A1 | 8/2023 | Iwaki et al. | |
| 2023/0327630 | A1 | 10/2023 | Goto et al. | |
| 2023/0327642 | A1 | 10/2023 | Goto et al. | |
| 2023/0327645 | A1 | 10/2023 | Goto et al. | |
| 2023/0336145 | A1 | 10/2023 | Goto et al. | |
| 2023/0336159 | A1 | 10/2023 | Hiramatsu et al. | |
| 2024/0039507 | A1 | 2/2024 | Goto et al. | |
| 2024/0088867 | A1 | 3/2024 | Kaneda et al. | |
| 2024/0186978 | A1 | 6/2024 | Hiramatsu et al. | |

* cited by examiner

SURFACE ACOUSTIC WAVE DEVICE WITH ACOUSTIC WAVE ENERGY CONFINEMENT

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to surface acoustic wave devices and electronic devices including such surface acoustic wave devices.

Description of Related Technology

Acoustic wave devices, in particular surface acoustic wave (surface acoustic wave) devices, can be utilized as components of filters in radio frequency electronic systems. For instance, filters in a radio frequency front-end of a mobile phone can include acoustic wave filters. Surface acoustic wave devices are made of piezoelectric materials and comprise an interdigital transducer pattern provided by a photolithographic or other manufacturing process.

A surface acoustic device usually includes an interdigital transducer (IDT) electrode located between reflectors on the piezoelectric material. Reflectors with gratings are provided to suppress energy leakage in a propagation direction of the surface acoustic wave. Providing reflectors on both sides of the interdigital transducer electrode requires some area on the die when manufacturing the surface acoustic wave device. Accordingly, there is a need to confine energy leakage on the propagation direction of the surface acoustic wave surface acoustic wave while minimizing the size occupied by the fabricated surface acoustic wave device on a die.

SUMMARY

In accordance with one aspect of the present disclosure, there is provided an acoustic wave device.

The surface acoustic wave device comprises at least one interdigital transducer provided on a piezoelectric substrate of said surface acoustic wave device and includes a trench formed adjacent to the at least one interdigital transducer electrode into the piezoelectric substrate and adapted to enhance confinement of acoustic wave energy provided by the interdigital transducer electrode.

In embodiments of the surface acoustic wave device, the trench is adapted to suppress energy leakage from the surface acoustic device in a propagation direction of a surface acoustic wave excited by the interdigital transducer.

In embodiments of the surface acoustic wave device, the piezoelectric substrate comprises lithium tantalate.

In a further embodiment of the surface acoustic wave device, the piezoelectric substrate comprises lithium niobate.

In a further embodiment of the surface acoustic wave device, the interdigital transducer electrode includes metal electrode fingers provided on the piezoelectric substrate.

In embodiments of the surface acoustic wave device, the metal electrode fingers of the interdigital transducer electrode are connected alternately to two bus bars located on opposite sides of the surface acoustic wave device.

In a still further embodiments of the surface acoustic wave device, the metal electrode fingers of the interdigital transducer electrode are covered by a temperature compensating layer.

In embodiments of the surface acoustic wave device, the temperature compensating layer is a silicon dioxide layer.

In a further embodiment of the surface acoustic wave device, the piezoelectric substrate forms a piezoelectric substrate layer of a multilayer piezoelectric substrate.

In a further embodiment of the surface acoustic wave device, the multilayer piezoelectric substrate includes the piezoelectric substrate layer provided on a temperature compensating layer and a support substrate.

In a further embodiment of the surface acoustic wave device, the support substrate of the multilayer piezoelectric substrate includes at least one of silicon, aluminum nitride, silicon nitride, magnesium oxide spinel, magnesium oxide crystal, or diamond.

In a further embodiment of the surface acoustic wave device, the temperature compensating layer of the multilayer piezoelectric substrate is a silicon dioxide layer.

In a further embodiment of the surface acoustic wave device, the surface acoustic wave device includes a one-port SAW resonator having a single interdigital transducer electrode placed between two opposite trenches.

In a further embodiment of the surface acoustic wave device, the surface acoustic wave device includes multiple SAW resonators or longitudinally coupled resonator filters having a transmitter interdigital transducer electrode or a receiver interdigital transducer electrode placed between two opposite trenches.

In a further embodiment of the surface acoustic wave device, the surface acoustic wave device is adapted to filter a radio frequency signal.

In a further embodiment of the surface acoustic wave device, the trench is etched into the piezoelectric substrate.

In still further embodiments of the surface acoustic wave device, the interdigital transducer electrode includes metal electrode fingers provided on the piezoelectric substrate and having a predefined finger pitch.

In a further embodiment of the surface acoustic wave device, the trench formed adjacent to the interdigital transducer electrode includes a smooth edge having a distance to a closest metal electrode finger of the interdigital transducer electrode determined by the wavelength of the surface acoustic wave excited by the interdigital transducer electrode.

In a further embodiment of the surface acoustic wave device, the distance of the edge of the trench to the closest metal electrode finger of the interdigital transducer electrode is adapted to maximize a reflection of the surface acoustic wave excited by the interdigital transducer electrode.

In a further embodiment of the surface acoustic wave device, the trench formed adjacent to the interdigital transducer electrode includes a smooth edge having a predefined angle relative to the piezoelectric substrate.

In a still further embodiment of the surface acoustic wave device, the angle is adapted to maximize a reflection of the surface acoustic wave excited by the interdigital transducer electrode.

In a further embodiment of the surface acoustic wave device, the trench formed adjacent to the interdigital transducer electrode includes a smooth edge and a predefined depth within the piezoelectric substrate.

In a further embodiment of the surface acoustic wave device, the depth of the trench formed adjacent to the interdigital transducer electrode is adapted to maximize a reflection of the surface acoustic wave excited by the interdigital transducer electrode.

According to a further aspect of the disclosure, an electronic apparatus comprises a surface acoustic wave device having at least one interdigital transducer provided on a piezoelectric substrate of the surface acoustic wave device and having a trench formed adjacent to the at least one interdigital transducer electrode into the piezoelectric substrate and adapted to enhance confinement of acoustic wave energy provided by the interdigital transducer electrode.

In embodiments of the electronic apparatus, the trench formed adjacent to the interdigital transducer electrode includes a smooth edge having a distance to a closest metal electrode finger of the interdigital transducer electrode. In some embodiments thereof, the edge has a predefined angle relative to the piezoelectric substrate and the trench has a predefined depth within the piezoelectric substrate.

In embodiments of the electronic apparatus, the distance, the angle and the depth of the edge of the trench formed adjacent to the interdigital transducer electrode are configured to maximize a reflection of the surface acoustic wave excited by the interdigital transducer IDT.

According to a further aspect of the disclosure, a radio frequency module comprises a surface acoustic wave device having at least one interdigital transducer electrode provided on a piezoelectric substrate of said surface acoustic wave device and having at least one trench formed adjacent to the at least one interdigital transducer into the piezoelectric substrate and adapted to enhance confinement of acoustic wave energy provided by the interdigital transducer electrode.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
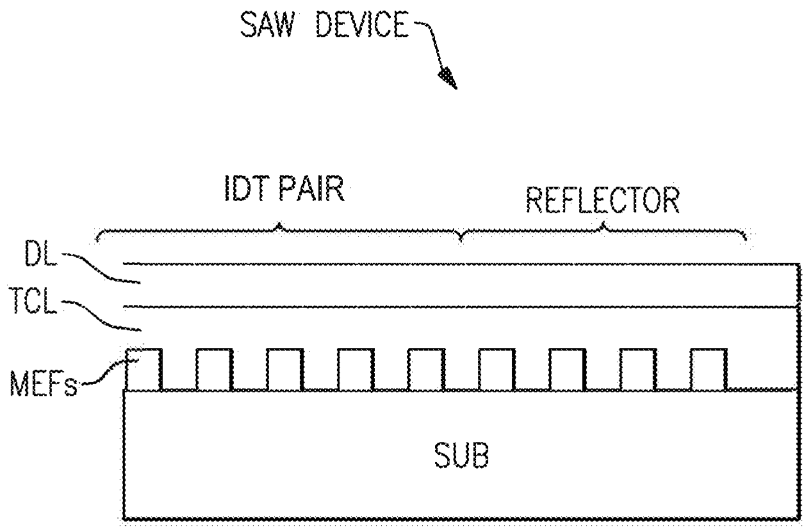
FIG. 1A is a cross-section view through a surface acoustic wave device having grating reflectors.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Figure 1B:
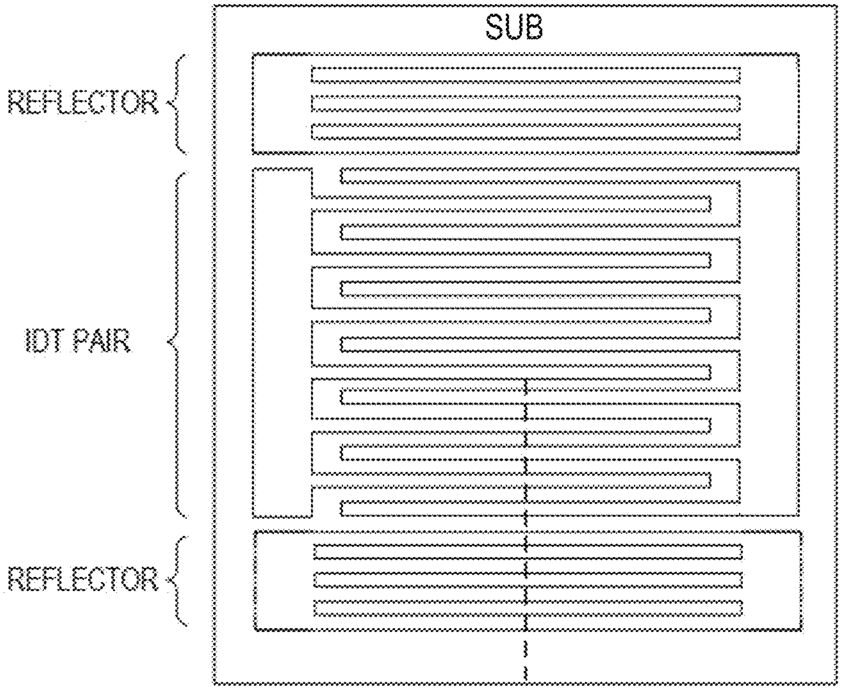
FIG. 1B is a top view of a surface acoustic wave device such as the device of FIG. 1A.

FIG. 1A shows a schematic cross-section view illustrating a structure of a surface acoustic wave (SAW) device 1. FIG. 1B shows a top view of a device such as the device of FIG. 1A. For example, the cross-section of FIG. 1A is taken along the dashed line shown in FIG. 1B. The surface acoustic wave (SAW) device shown in FIG. 1A comprises at least one interdigital transducer (IDT) electrode made of an IDT electrode pair and having adjacent grating reflectors to suppress energy leakage in a propagating direction of the surface acoustic wave SAW excited by the IDT electrode. For example, FIG. 1B shows that the device can include an IDT electrode pair with two reflectors, each positioned on an opposing side of the IDT pair.

As can be seen from the cross-section view of FIG. 1A, the IDT electrode is provided on a piezoelectric substrate SUB. The IDT electrode comprises metal electrode fingers MEFs provided on the piezoelectric substrate SUB. As shown in FIG. 1A, these metal electrode fingers MEFs can be covered by a temperature compensating layer TCL and a dielectric layer DL on top. The fabrication of the grating reflectors adjacent to the IDT electrode requires some area on the die. As shown in FIG. 1B, the IDT electrode pair includes a first plurality of electrode fingers attached to a first busbar (left), where the fingers are interdigitated with a second plurality of electrode fingers attached to a second busbar (right).

Figure 2A:
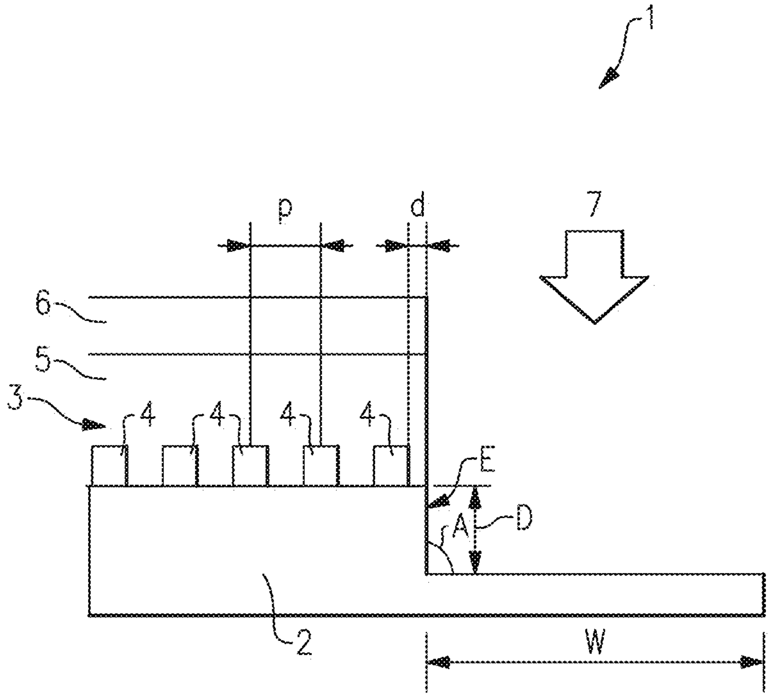
FIG. 2A is a cross-section view illustrating a possible exemplary embodiment of a surface acoustic wave device according to an embodiment.
Figure 2B:
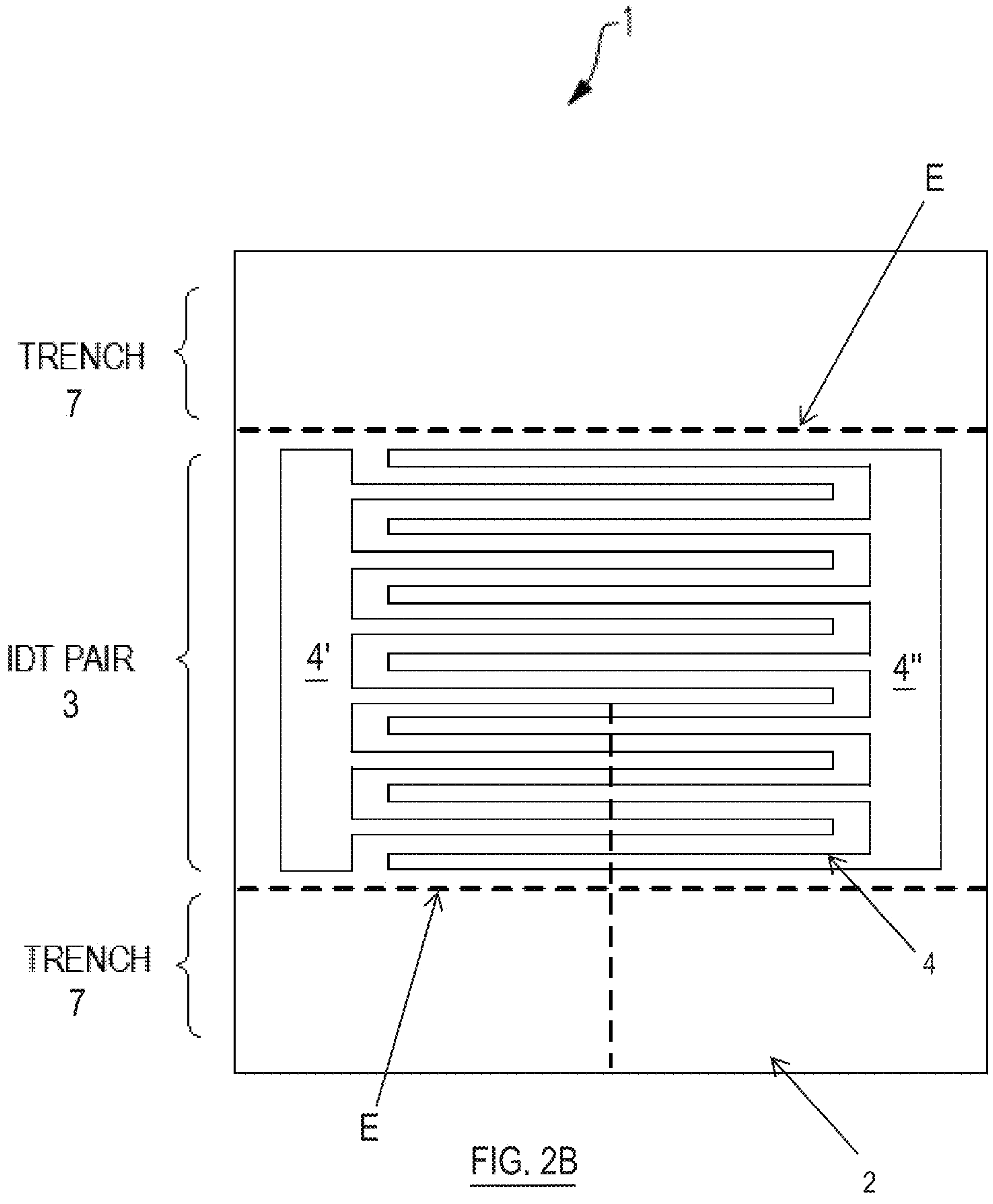
FIG. 2B is a top view of a surface acoustic wave device such as the device of FIG. 2A.

FIG. 2A shows a cross-section view through a possible exemplary embodiment of a surface acoustic wave (SAW) device 1 according to an embodiment. FIG. 2B shows a top view of a SAW device 1, such as the SAW device 1 of FIG. 2A. For example, the cross-section shown in FIG. 2A can be taken along the vertical dashed line in FIG. 2B. As shown, the SAW device 1 includes a piezoelectric substrate 2. The piezoelectric substrate 2 can comprise different materials, in particular lithium tantalite (LT) or lithium niobate (LB).

At least one interdigital transducer (IDT) electrode 3 of the SAW device 1 is provided on the piezoelectric substrate 2 of the SAW device 1. The IDT electrode 3 comprises metal electrode fingers 4 provided on the piezoelectric substrate 2 of the SAW device 1. As shown in FIG. 2B, the at least one IDT electrode can comprise an electrode pair having metal electrode fingers 4 of the IDT electrode 3, which can be connected in an alternating, interdigitated manner between two bus bars 4', 4" located on opposite sides of the SAW device 1.

In some embodiments, the metal electrode fingers 4 of the IDT electrode 3 have a predefined finger pitch p indicating a distance between neighboring metal electrode fingers 4 (center to center). In the embodiment illustrated in FIG. 2A, the metal electrode fingers 4 of the IDT electrode 3 are covered by a temperature compensating layer 5. In embodiments, the temperature compensating layer 5 can include a silicon dioxide layer. The temperature compensating layer 5 can be covered by a further dielectric layer 6.

The SAW device 1 as shown in the cross-section view of FIG. 2 includes a trench 7 formed adjacent to the at least one IDT electrode 3 into the piezoelectric substrate 2. The trench 7 is adapted to enhance confinement of acoustic wave energy provided by the IDT electrode 3. The trench 7 has a depth D and a width W as shown schematically in FIG. 2. Further, the trench 7 formed adjacent to the IDT electrode 3 includes a smooth edge E having a predefined angle A relative to the piezoelectric substrate 2. In the illustrated schematic diagram of FIG. 2, the angle A is about 90 degrees. In various implementations, the predefined angle can be in a range from about 80-100 degrees, 85-95 degrees, or 87.5-92.5 degrees, or have a value within 1 percent of 90 degrees, depending on the embodiment.

In embodiments, the SAW device 1 may include a one-port SAW resonator having a single IDT electrode 3 which may be placed between two opposite trenches 7. FIG. 2B shows that the device 1 can have opposite trenches 7 on opposite sides of the IDT electrode 3, for example, where the edge E of each trench 7 is delineated by applicable horizontal dashed line. In another embodiment of the surface acoustic wave device 1, the surface acoustic wave device 1 can include multiple SAW resonators or longitudinally coupled resonator filters CRFs having a transmitter IDT and a receiver IDT placed between two opposite trenches 7.

The SAW device 1 fabricated as illustrated in FIGS. 2A-2B can be adapted to filter a radio frequency signal. The SAW device 1 can be configured as a band pass filter. Each trench 7 formed adjacent to the IDT electrode 3 is adapted to suppress energy leakage from the SAW device 1 in a propagation direction of a SAW excited by the IDT electrode 3.

In embodiments, the trench 7 can be etched through the piezoelectric layers 5, 7 into the piezoelectric substrate 2. The trench 7 formed adjacent to the IDT electrode 3 includes a smooth edge E having a distance d to a closest metal electrode finger 4 of the IDT electrode 3. The distance d between the smooth edge of the trench 7 and the closest metal electrode finger 4 of the IDT electrode 3 depends on the wavelength of the SAW excited by the IDT electrode 3. The distance d of the edge of the trench 7 to the closest metal electrode finger 4 of the IDT electrode 3 is adapted to maximize a signal reflection of the SAW excited by the respective IDT electrode 3.

The trench 7 formed adjacent to the IDT electrode 3 includes a smooth edge E having a predefined angle A relative to the piezoelectric substrate 2. In embodiments, the angle A is adapted to maximize a reflection of the SAW excited by the interdigital transducer 3. The trench 7 further includes a smooth edge E and a predefined depth D within the piezoelectric substrate 2 as shown in FIG. 2. The depth D of the trench 7 formed adjacent to the IDT electrode 3 can also be adapted to maximize a reflection of the SAW excited by the IDT electrode 3.

Accordingly, different parameters can define the reflection capabilities of the trench 7 formed adjacent to the at least one interdigital transducer 3. These parameters may include the distance d of the edge of the trench to the closest metal electrode finger 4 of the IDT electrode 3, the depth D of the trench 7 on the piezoelectric substrate 2, the width W of the trench 7 and the angle A of the edge of the trench 7 relative to the plane of a piezoelectric substrate layer 2. Different parameters of the trench 7, i.e. the distance d of its edge E to the closest finger, the depth D and the width W as well as the angle A are optimized to maximize a reflection of the SAW excited by the interdigital transducer 3.

The angle A of the edge E can be formed to be around 90 degrees. The angle A may be varied in a defined angle range to maximize signal reflection in line with the applied etching process. The parameters can be varied independently from each other and may provide different results for optimized signal reflection depending on a layer thickness and used materials of the different layers 2, 5, and 6 shown in the embodiment of FIG. 2 or of the layers 2, 8, and 9 shown in the embodiment of FIG. 4.

The distance d is specifically chosen to cause the reflected wave to return with the incident wave. The distance d can be defined by using piezoelectric simulation or vibrometer measurements to ensure that the reflected wave returns in phase with the incident wave. A standing wave is formed by the specified parameters. Thus, the distance d can be such that the reflected wave's potential is in phase with the voltage applied to the IDT electrode.

In embodiments, the trench 7 formed adjacent to the at least one IDT electrode 3 is manufactured in an etching process. Different kinds of etching processes can be applied. The etching may be performed by chemical etching or reactive-ion etching. Further, the trench 7 may be manufactured using a laser ablation process.

Figure 3:
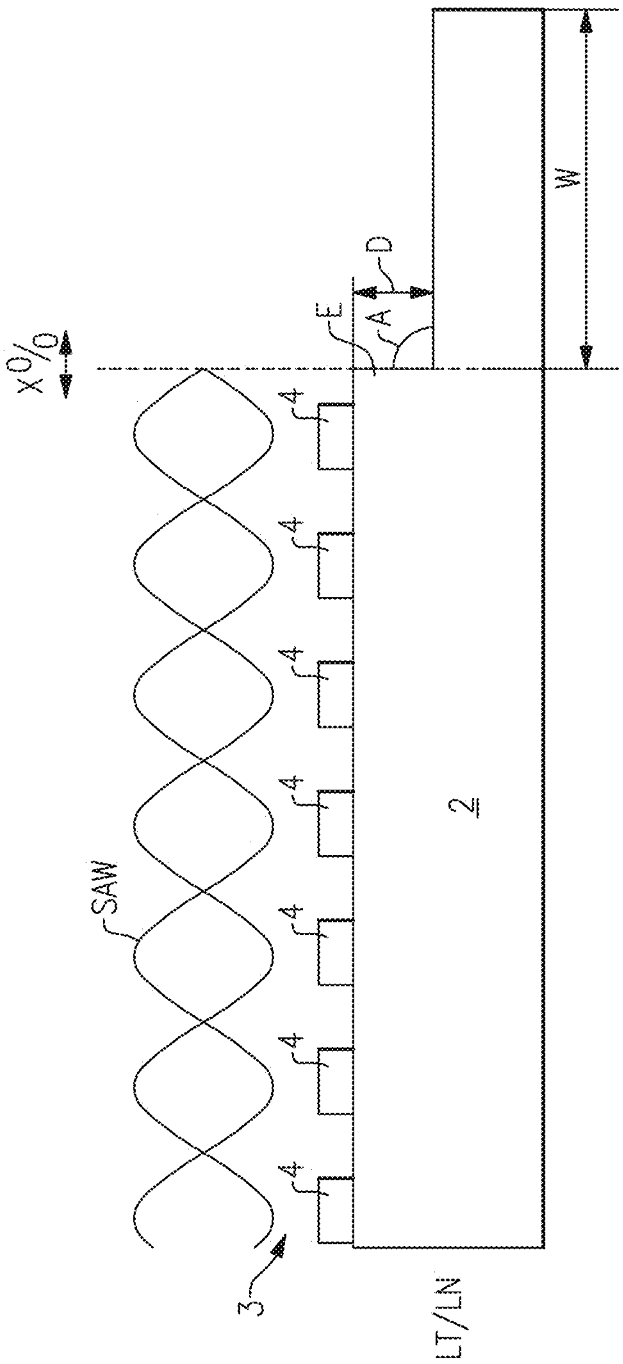
FIG. 3 is a further cross-section view to illustrate the operation of a surface acoustic wave device according to an embodiment.

FIG. 3 illustrates the operation of a SAW device 1 according an embodiment having a SAW excited by the IDT electrode 3 reflected by the trench 7.

Figure 4:
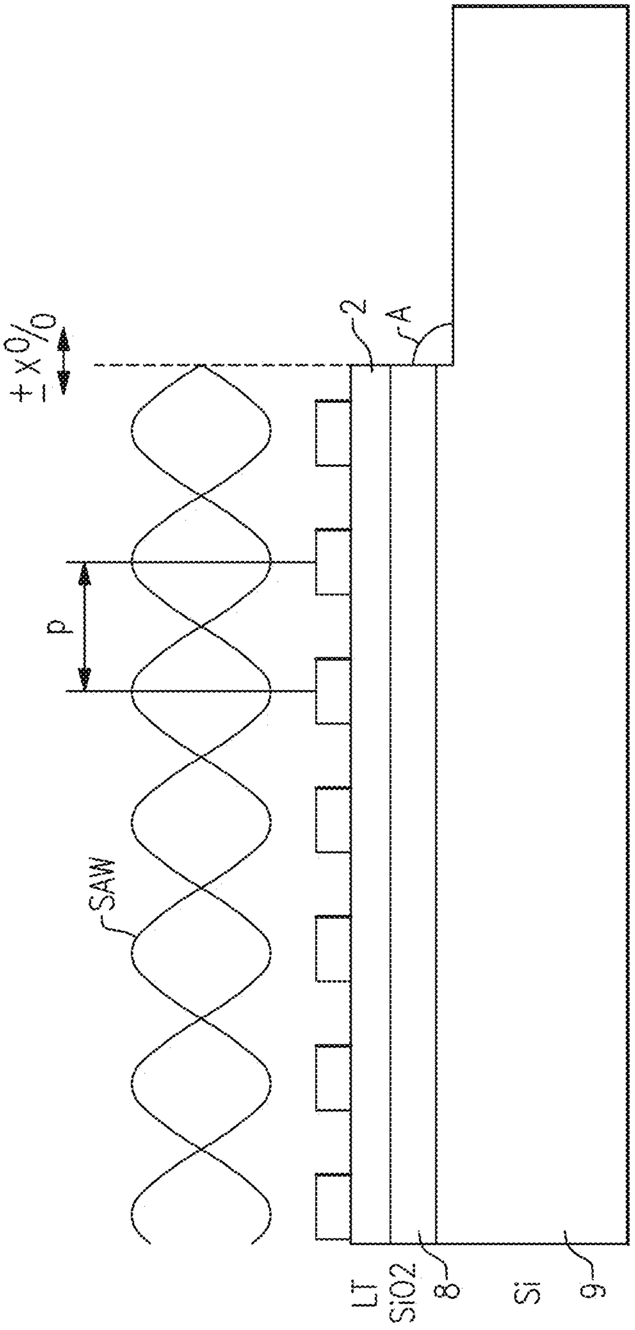
FIG. 4 shows a further cross-section view of a further possible exemplary embodiment of a surface acoustic wave device according to an embodiment.

FIG. 4 illustrates a further exemplary embodiment of a SAW device 1 wherein the piezoelectric substrate 2 forms a piezoelectric substrate layer of a multilayer piezoelectric substrate (MPS). The MPS includes the piezoelectric substrate layer 2 provided on a temperature compensating layer 8 which can be made of silicon dioxide. The temperature compensating layer 8 can be provided on a support substrate 9 as illustrated in the cross-section view of FIG. 4. The support substrate 9 can be made of silicon. The support substrate 9 can also include aluminum nitride, silicon nitride, magnesium oxide spinel, magnesium oxide crystal, or a diamond material.

In embodiments, the different parameters of the manufactured trench 7 can be varied in an optimization process to maximize signal reflection of the SAW excited by the adjacent IDT electrode 3. The distance d to the closest metal finger 4 of the IDT electrode 3 depends on the pitch p between the metal fingers 4 of the IDT electrode 3.

In embodiments, the distance d is a multiple of the pitch p between the metal fingers 4 of the IDT electrode 3. The SAW is excited by applying a proper electrical signal to the IDT electrode 3. The trench 7 can be provided for reflecting the incident surface acoustic waves SAWs. The reflection can be achieved without the provision of grating reflectors.

Consequently, the SAW device 1 according to an embodiment requires less space when integrated on a die. In embodiments, the trench 7 is formed on both sides of the IDT electrode 3. In this embodiment, the IDT electrode 3 is sandwiched between two adjacent trenches 7. The SAW device 1 can include multiple IDT electrodes 3 sandwiched between trenches 7. The trenches 7 sandwich the IDT electrodes 3 and reflect the main SAW. The SAW travels perpendicular to the lengthwise direction of the IDT electrodes 4. The edge E of the trench 7 is directed in parallel to the metal fingers 4 of the IDT electrode 3.

Other embodiments are possible. For instance, in the embodiments of FIG. 2 and FIG. 4, a single trench 7 is formed adjacent the IDT electrode 3. In further embodiments several trenches 7 can be formed in parallel adjacent to the IDT electrode 3. These trenches 7 can comprise different depths D, widths W, angles A and distances d to the closest metal finger 4.

The surface acoustic wave device 1 can be implemented in a variety of packaged modules. As discussed above, embodiments of the SAW elements can be configured as or used in filters, for example. In turn, a SAW filter using one or more SAW elements may be incorporated into and packaged as a module that may ultimately be used in an electronic device, such as a wireless communications device.

Figure 5:
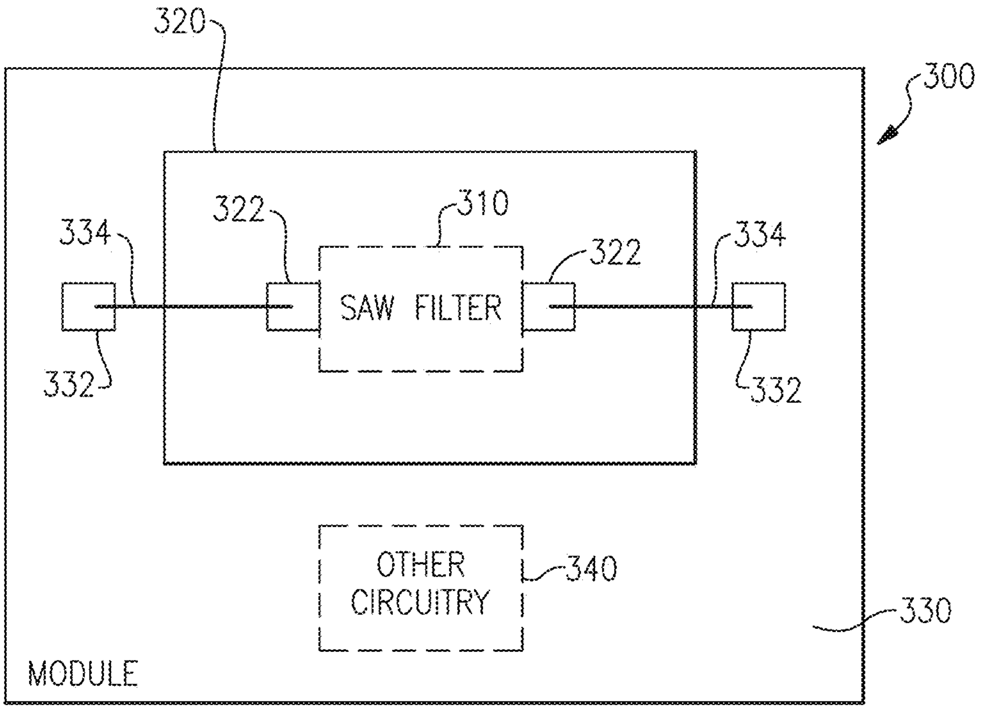
FIG. 5 is a block diagram of an exemplary filter module that can include one or more surface acoustic wave devices according to an embodiment.

For example. FIG. 5 is a block diagram illustrating one example of a module 300 including a SAW filter 310. The SAW filter 310 may be implemented on one or more die(s) 320 including one or more connection pads 322. The SAW filter 310 can comprise any of the SAW devices of FIG. 2A, 2B, 3, or 4, for instance. For example, the SAW filter 310 may include a connection pad 322 that corresponds to an input contact for the SAW filter and another connection pad 322 that corresponds to an output contact for the SAW filter. The packaged module 300 includes a packaging substrate 330 that is configured to receive a plurality of components, including the die 320. A plurality of connection pads 332 can be disposed on the packaging substrate 330, and the various connection pads 322 of the SAW filter die 320 can be connected to the connection pads 332 on the packaging substrate 330 via electrical connectors 334, which can be solder bumps or wirebonds, for example, to allow for passing of various signals to and from the SAW filter 310.

The module 300 may optionally further include other circuitry die 340, such as, for example one or more additional filter(s), amplifiers, pre-filters, modulators, demodulators, down converters, and the like, as would be known to one of skill in the art of semiconductor fabrication in view of the disclosure herein. In some embodiments, the module 300 can also include one or more packaging structures to, for example, provide protection and facilitate easier handling of the module 300. Such a packaging structure can include an overmold formed over the packaging substrate 330 and dimensioned to substantially encapsulate the various circuits and components thereon.

Various examples and embodiments of the SAW filter 310 can be used in a wide variety of electronic devices. For example, the SAW filter 310 can be used in an antenna duplexer, which itself can be incorporated into a variety of electronic devices, such as RF front-end modules and communication devices.

Figure 6:
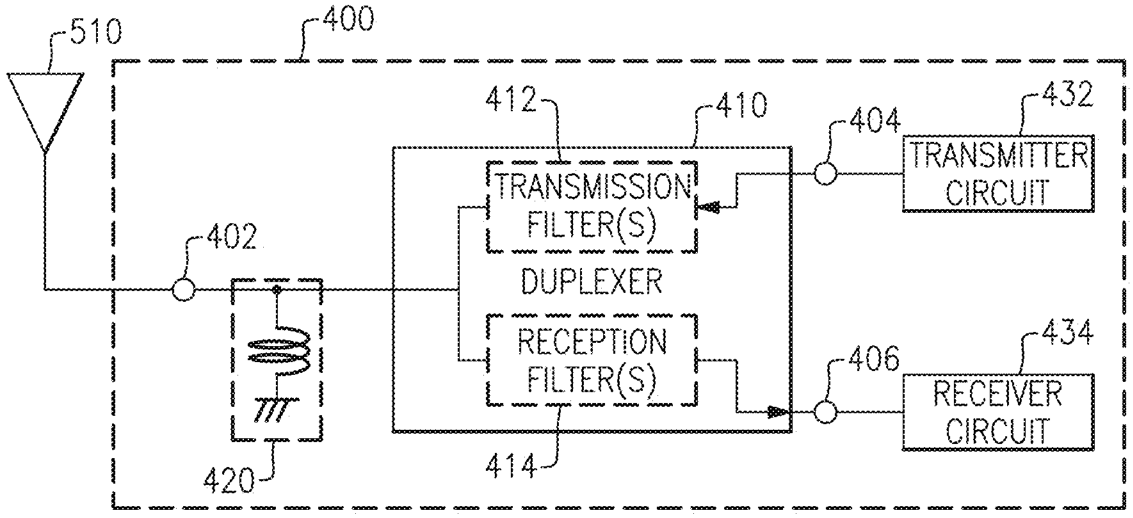
FIG. 6 is a block diagram of an exemplary front-end module that can include one or more filter modules according to an embodiment.

Referring to FIG. 6, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter (s) are different from the passband(s) of the reception filters. Examples of the SAW filter 310 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510.

In some embodiments, the receiver and transmitter circuits are implemented as separate components, as shown in FIG. 6, however in other embodiments these components may be integrated into a common transceiver circuit or module. As will be appreciated by those skilled in the art, the front-end module 400 may include other components that are not illustrated in FIG. 6 including, but not limited to, switches, electromagnetic couplers, amplifiers, processors, and the like. The transmission filter(s) 412 and/or reception filter(s) 414 can include any of the SAW filter 310 of FIG. 5 or any the SAW devices of FIG. 2A, 2B, 3, or 4, for instance.

Figure 7:
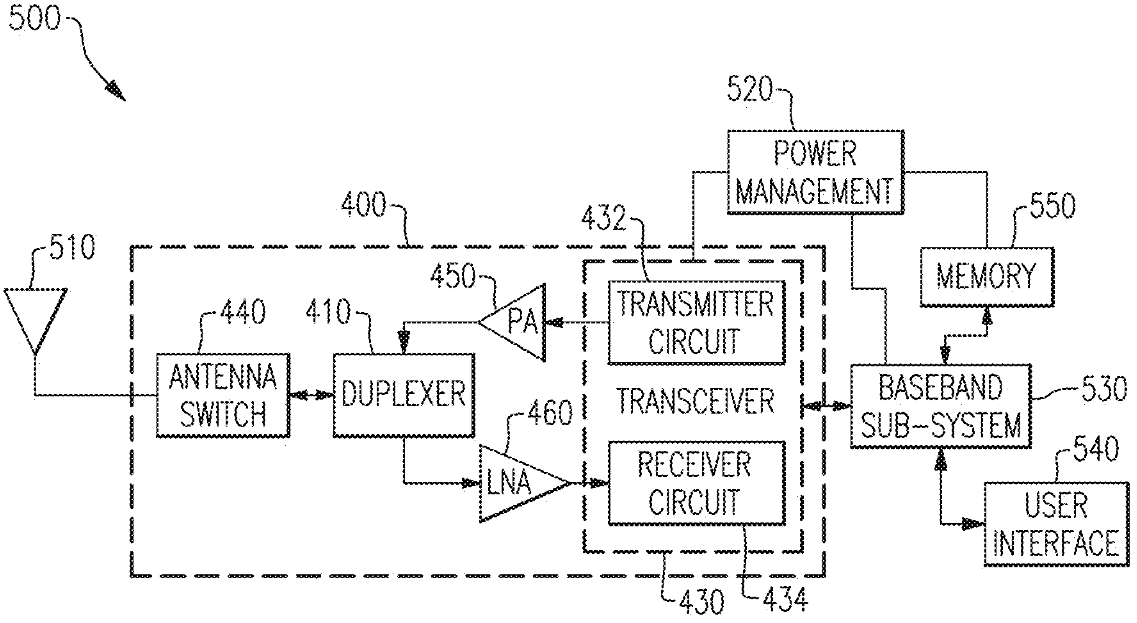
FIG. 7 is a block diagram of an example of a wireless device including the front end module of FIG. 6.

FIG. 7 is a block diagram of one example of a wireless device 500 including the antenna duplexer 410 shown in FIG. 6. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 6. The front-end module 400 includes the duplexer 410, as discussed above.

In the example shown in FIG. 7, the front-end module 400 further includes an antenna switch 440, which can be configured to switch between different frequency bands or modes, such as transmit and receive modes, for example. In the example illustrated in FIG. 7, the antenna switch 440 is positioned between the duplexer 410 and the antenna 510; however, in other examples the duplexer 410 can be positioned between the antenna switch 440 and the antenna 510. In other examples, the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 6.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal.

The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal.

In certain embodiments, the power amplifier module 450 and associated components including switches and the like can be fabricated on gallium arsenide (GaAs) substrates using, for example, high-electron mobility transistors (HEMT) or insulated-gate bipolar transistors (BiFET), or on a silicon substrate using complementary metal-oxide semiconductor (CMOS) field effect transistors.

Still referring to FIG. 7, the front-end module 400 may further include a low noise amplifier module 460, which amplifies received signals from the antenna 510 and provides the amplified signals to the receiver circuit 434 of the transceiver 430.

The wireless device 500 of FIG. 7 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an car piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense, that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The invention claimed is:

1. A surface acoustic wave device comprising:

a piezoelectric substrate;

at least one interdigital transducer electrode provided on the piezoelectric substrate; and a trench formed adjacent to the at least one interdigital transducer electrode into the piezoelectric substrate and adapted to enhance confinement of acoustic wave energy provided by the at least one interdigital transducer electrode, the trench including an edge having a distance to a closest metal electrode finger of the at least one interdigital transducer electrode determined by a wavelength of a surface acoustic wave excited by the at least one interdigital transducer electrode, the distance of the edge of the trench to the closest metal electrode finger adapted to maximize a reflection of a surface acoustic wave excited by the at least one interdigital transducer electrode.

2. The surface acoustic wave device of claim 1 wherein the trench is adapted to suppress energy leakage from the surface acoustic wave device in a propagation direction of a surface acoustic wave excited by the at least one interdigital transducer electrode.

3. The surface acoustic wave device of claim 1 wherein the piezoelectric substrate includes lithium tantalate or lithium niobate.

4. The surface acoustic wave device of claim 1 wherein the at least one interdigital transducer electrode includes interdigitated metal electrode fingers provided on the piezoelectric substrate and connected alternately to two bus bars located on opposite sides of the surface acoustic wave device.

5. The surface acoustic wave device of claim 4 wherein the interdigitated metal electrode fingers of the at least one interdigital transducer electrode are covered by a temperature compensating layer.

6. The surface acoustic wave device of claim 5 wherein the temperature compensating layer is a silicon dioxide layer.

7. The surface acoustic wave device of claim 1 wherein the piezoelectric substrate forms a piezoelectric substrate layer of a multilayer piezoelectric substrate.

8. The surface acoustic wave device of claim 7 wherein the multilayer piezoelectric substrate includes the piezoelectric substrate layer provided on a temperature compensating layer and a support substrate.

9. The surface acoustic wave device of claim 8 wherein the support substrate of the multilayer piezoelectric substrate includes at least one of silicon, aluminum nitride, silicon nitride, magnesium oxide spinel, magnesium oxide crystal, and diamond, and the temperature compensating layer of the multilayer piezoelectric substrate includes silicon dioxide.

10. The surface acoustic wave device of claim 1 wherein the surface acoustic wave device is a one-port surface acoustic wave resonator having a single interdigital transducer placed between two opposite trenches.

11. The surface acoustic wave device of claim 1 further comprising multiple surface acoustic wave resonators or longitudinally coupled resonator filters having a transmitter interdigital transducer electrode and a receiver interdigital transducer electrode placed between two opposite trenches.

12. The surface acoustic wave device of claim 1 wherein the trench is etched into the piezoelectric substrate.

13. The surface acoustic wave device of claim 1 wherein the at least one interdigital transducer electrode includes metal electrode fingers provided on the piezoelectric substrate and having a predefined finger pitch.

14. The surface acoustic wave device of claim 1 wherein the edge has a predefined angle relative to the piezoelectric substrate adapted to maximize a reflection of a surface acoustic wave excited by the at least one interdigital transducer electrode.

15. The surface acoustic wave device of claim 1 wherein the edge has a predefined depth within the piezoelectric substrate, the predefined depth formed adapted to maximize a reflection of a surface acoustic wave excited by the at least one interdigital transducer electrode.

16. An electronic apparatus comprising:

a surface acoustic wave device including a piezoelectric substrate, at least one interdigital transducer electrode provided on the piezoelectric substrate and a trench formed adjacent to the at least one interdigital transducer electrode into the piezoelectric substrate and adapted to enhance confinement of acoustic wave energy provided by the at least one interdigital transducer electrode, the trench including an edge having a distance to a closest metal electrode finger of the at least one interdigital transducer electrode determined by a wavelength of a surface acoustic wave excited by the at least one interdigital transducer electrode, the distance of the edge of the trench to the closest metal electrode finger adapted to maximize a reflection of a surface acoustic wave excited by the at least one interdigital transducer electrode.

17. The electronic apparatus of claim 16 wherein the trench is adapted to suppress energy leakage from the surface acoustic wave device in a propagation direction of a surface acoustic wave excited by the at least one interdigital transducer electrode.

18. A radio frequency module comprising:

a surface acoustic wave device including a piezoelectric substrate, at least one interdigital transducer electrode provided on the piezoelectric substrate and a trench formed adjacent to the at least one interdigital transducer electrode into the piezoelectric substrate and adapted to enhance confinement of acoustic wave energy provided by the at least one interdigital transducer electrode, the trench including an edge having a distance to a closest metal electrode finger of the at least one interdigital transducer electrode determined by a wavelength of a surface acoustic wave excited by the at least one interdigital transducer electrode, the distance of the edge of the trench to the closest metal electrode finger adapted to maximize a reflection of a surface acoustic wave excited by the at least one interdigital transducer electrode.

19. The radio frequency module of claim 18 wherein the trench is adapted to suppress energy leakage from the surface acoustic wave device in a propagation direction of a surface acoustic wave excited by the at least one interdigital transducer electrode.

* * * * *